United States Patent
Cho et al.

(10) Patent No.: US 10,720,596 B2
(45) Date of Patent: Jul. 21, 2020

(54) ORGANIC LIGHT EMITTING DISPLAY PANEL

(71) Applicant: LG Display Co., Ltd., Seoul (KR)

(72) Inventors: Young-Dock Cho, Busan (KR); Kwang-Yeon Lee, Paju-si (KR); Heui-Dong Lee, Paju-si (KR); Eun-Jung Park, Daegu (KR); Hong-Je Yun, Paju-si (KR); Sang-Kyoung Moon, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/937,931

(22) Filed: Jul. 9, 2013

(65) Prior Publication Data
US 2014/0070187 A1    Mar. 13, 2014

(30) Foreign Application Priority Data
Sep. 11, 2012    (KR) .................... 10-2012-0100317

(51) Int. Cl.
*H01L 51/52*    (2006.01)

(52) U.S. Cl.
CPC .......... *H01L 51/52* (2013.01); *H01L 51/5256* (2013.01); *H01L 51/5262* (2013.01); *H01L 2251/5315* (2013.01); *H01L 2251/55* (2013.01); *H01L 2251/558* (2013.01)

(58) Field of Classification Search
CPC ............. H01L 51/5215; H01L 51/5218; H01L 51/5234; H01L 51/5243; H01L 51/5256; H01L 51/5265; H01L 51/5271; H01L 51/5275; H01L 51/52–56

USPC .......................................................... 257/98
See application file for complete search history.

(56) References Cited

U.S. PATENT DOCUMENTS

2003/0071569 A1*    4/2003    Chung et al. ................. 313/512
2008/0203908 A1*    8/2008    Hasegawa et al. ........... 313/504
2008/0237615 A1    10/2008    Lee et al.
(Continued)

FOREIGN PATENT DOCUMENTS

| CN | 1549659 A | 11/2004 |
| CN | 101931057 | 12/2010 |

(Continued)

OTHER PUBLICATIONS

First Office Action for Chinese Patent Application No. CN 201310243935.8, dated Jul. 2, 2015, 14 Pages.
(Continued)

*Primary Examiner* — Robert T Huber
*Assistant Examiner* — Gardner W. S. Swan
(74) *Attorney, Agent, or Firm* — Fenwick & West LLP

(57) ABSTRACT

The organic light emitting display panel includes a first electrode formed on a substrate, an organic light emitting layer formed on the first electrode, a second electrode formed on the organic light emitting layer, a front sealing layer formed on the second electrode, wherein the front sealing layer is formed by alternately laminating an inorganic barrier layer and an organic barrier layer at least once, and at least one capping layer formed between the lowest layer closest to the second electrode among a plurality of thin films of the front sealing layer and the second electrode and having a higher index of refraction than an index of refraction of the lowest layer.

6 Claims, 6 Drawing Sheets

(56) References Cited

U.S. PATENT DOCUMENTS

2009/0212692 A1\* 8/2009 Hasegawa ............ H01L 51/5265
                                                      313/504
2010/0320446 A1   12/2010 Kang et al.
2010/0320481 A1\* 12/2010 Kashiwabara ...... H01L 27/3244
                                                      257/88

FOREIGN PATENT DOCUMENTS

| CN | 102487070 | 6/2012 |
|---|---|---|
| EP | 1 657 764 A1 | 5/2006 |
| KR | 10-2006-0042728 A | 5/2006 |
| KR | 10-2010-0138773 A | 12/2010 |
| TW | 586330 | 5/2004 |

OTHER PUBLICATIONS

Fourth Office Action for Chinese Patent Application No. CN 201310243935.8, dated Sep. 18, 2016, 15 Pages.
Third Office Action for Chinese Patent Application No. CN 201310243935.8, dated Jun. 27, 2016, 16 Pages.
Korean Intellectual Property Office, Office Action, Korean Patent Application No. 10-2012-0100317, dated Jun. 26, 2018, seven pages (with concise explanation of relevance).

\* cited by examiner

| THICKNESS (nm) | Lum. | CIE_x | CIE_y | EFFICIENCY CHANGE(%) |
|---|---|---|---|---|
| 0(Ref.) | 8.8 | 0.134 | 0.06 | |
| 20 | 8.9 | 0.134 | 0.06 | 1.01 |
| 40 | 9.3 | 0.134 | 0.06 | 1.06 |
| 60 | 9.6 | 0.133 | 0.06 | 1.09 |
| 80 | 9.5 | 0.133 | 0.06 | 1.08 |
| 100 | 9.2 | 0.133 | 0.06 | 1.05 |
| 120 | 8.9 | 0.133 | 0.06 | 1.01 |
| 140 | 8.8 | 0.133 | 0.06 | 1.00 |

[ TABLE: BLUE LIGHT EFFICIENCY WITH RESPECT TO THICKNESS OF RESONANCE INDUCING LAYER ]

[ GRAPH: BLUE LIGHT EFFICIENCY WITH RESPECT TO THICKNESS OF RESONANCE INDUCING LAYER ]

| HTL(nm) | CONVENTIONAL CIE_y | FIRST EMBODIMENT CIE_y | SECOND EMBODIMENT CIE_y |
|---|---|---|---|
| 110 | 0.04 | 0.038 | 0.036 |
| 111 | 0.042 | 0.039 | 0.038 |
| 112 | 0.044 | 0.041 | 0.039 |
| 113 | 0.046 | 0.043 | 0.041 |
| 114 | 0.048 | 0.045 | 0.043 |
| 115 | 0.051 | 0.047 | 0.044 |
| 116 | 0.053 | 0.05 | 0.047 |
| 117 | 0.056 | 0.052 | 0.049 |
| 118 | 0.059 | 0.055 | 0.051 |
| 119 | 0.063 | 0.058 | 0.054 |
| 120 | 0.066 | 0.062 | 0.057 |
| 121 | 0.07 | 0.065 | 0.06 |
| 122 | 0.075 | 0.069 | 0.064 |
| 123 | 0.079 | 0.074 | 0.068 |
| 124 | 0.084 | 0.078 | 0.072 |
| 125 | 0.089 | 0.083 | 0.077 |
| 126 | 0.095 | 0.089 | 0.082 |
| 127 | 0.101 | 0.094 | 0.087 |
| 128 | 0.107 | 0.101 | 0.092 |
| 129 | 0.114 | 0.107 | 0.098 |
| 130 | 0.121 | 0.114 | 0.105 |

ORGANIC LIGHT EMITTING DISPLAY PANEL

CROSS-REFERENCE TO RELATED APPLICATIONS

This application claims the benefit of Korean Patent Application No. 10-2012-0100317, filed on Sep. 11, 2012 which is hereby incorporated by reference as if fully set forth herein.

BACKGROUND

Field of Technology

The embodiments herein relate to an organic light emitting display panel capable of improving luminous efficacy by efficiently extracting light generated in an organic light emitting layer.

Discussion of the Related Art

In recent years, a variety of flat panel display devices having reduced weight and volume, which are drawbacks of cathode ray tubes (CRTs), have been introduced. Examples of flat panel display devices are liquid crystal displays (LCDs), field emission displays (FEDs), plasma display panels (PDPs), and organic electroluminescent displays (ELDs). Among these display devices, an organic electroluminescent display is a self-emitting device operable without a backlight. Owing to excellent characteristics such as slim design, light weight, simple manufacturing process, wide viewing angle, rapid response, and high contrast ratio, the organic electroluminescent display is spotlighted as a next generation flat panel display.

In particular, an organic electroluminescent display device emits light using energy generated by transition of excitons, which are generated when holes injected from an anode and electrons injected from a cathode recombine in a light emitting layer, from an excited state to a ground state. All light beams generated in an organic light emitting layer of such an organic electroluminescent display device cannot reach the outside and most of the light beams are lost by total internal reflection. Since only about ¼ light beams generated in the organic light emitting layer reach the outside, the organic electroluminescent display device has low luminous efficacy.

Thus, there is still a need to develop various methods of improving luminous efficacy by efficiently extracting light generated in the organic light emitting layer.

SUMMARY

Accordingly, the embodiments herein are directed to an organic light emitting display panel that substantially obviates one or more problems due to limitations and disadvantages of the related art.

An object of the present invention is to provide an organic light emitting display panel capable of improving luminous efficacy by efficiently extracting light generated in an organic light emitting layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display panel includes a first electrode formed on a substrate, an organic light emitting layer formed on the first electrode, a second electrode formed on the organic light emitting layer, a front sealing layer formed on the second electrode, wherein the front sealing layer is formed by alternately laminating an inorganic barrier layer and an organic barrier layer at least once, and at least one capping layer formed between the lowest layer closest to the second electrode among a plurality of thin films of the front sealing layer and the second electrode and having a higher index of refraction than an index of refraction of the lowest layer.

The lowest layer may be the inorganic barrier layer closest to the second electrode among the plurality of thin films of the front sealing layer.

The lowest layer, as the inorganic barrier layer, may have an index of refraction of 1.2 to 3, and the capping layer has an index of refraction of 1.3 to 3.1.

The lowest layer, as the inorganic barrier layer, may have a thickness of 0.5 to 100 μm, and the capping layer may have a thickness of 20 to 200 nm.

The capping layer may have a single layer structure or a multilayer structure including silicon dioxide ($SiO_2$), silicon nitride ($SiN_x$), zinc sulfide (ZnS), lithium fluoride (LiF), PA, PI, tellurium dioxide ($TeO_2$), tungsten trioxide ($WO_3$), vanadium oxide ($V_2O_5$), aluminum oxide ($Al_xO_x$), zinc selenide (ZnSe), triamine derivatives, arylene diamine derivatives, CBP, or tris(8-hydroxyquinoline)aluminum (Alq3) complexes. The inorganic barrier layer may have a single layer structure or a multilayer structure including at least one selected from the group consisting of silicon oxide ($SiO_x$), silicon oxynitride (SiON), $SiN_x$, $Al_xO_x$ and LiF.

The lowest layer may be a resonance inducing layer formed between the inorganic barrier layer closest to the second electrode among the plurality of thin films of the front sealing layer and the capping layer, and the resonance inducing layer may have a lower index of refraction than indexes of refraction of the inorganic barrier layer closest to the second electrode and the capping layer.

The resonance inducing layer may have an index of refraction of 1.2 to 3, and the inorganic barrier layer closest to the second electrode and the capping layer may have indexes of refraction of 1.3 to 3.1.

The resonance inducing layer may have a single layer structure or a multilayer structure using at least one selected from the group consisting of PA, PI, triamine derivatives, arylene diamine derivatives, CBP, tris(8-hydroxyquinoline) aluminum (Alq3) complexes, $SiN_x$, $SiO_x$, SiON, and LiF.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
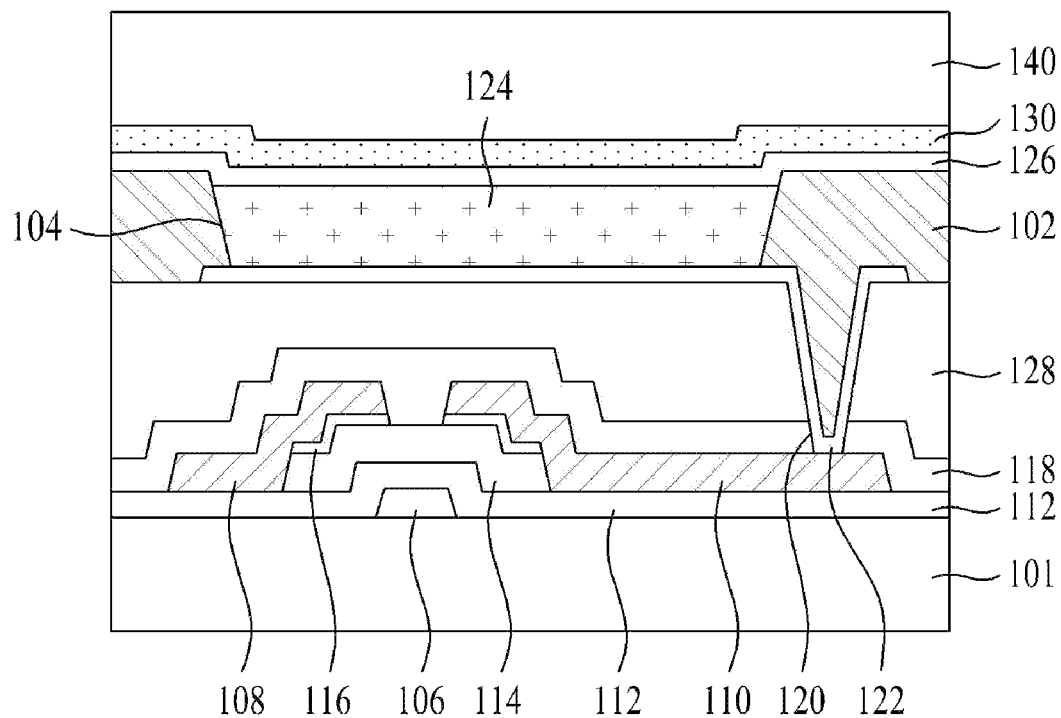
FIG. 1 is a cross-sectional view illustrating an organic light emitting display panel according to a first embodiment.

FIG. 1 is a cross-sectional view illustrating an organic light emitting display panel according to a first embodiment.

The organic light emitting display panel illustrated in FIG. 1 includes a thin film transistor, a light emitting cell connected to the thin film transistor, a capping layer 130 formed to protect the light emitting cell, and a front sealing layer 140.

The thin film transistor includes a gate electrode 106, a drain electrode 110 connected to a first electrode 122 of the light emitting cell, a source electrode 108 facing the drain electrode 110, an active layer 114 overlapping the gate electrode 106 while interposing a gate insulating layer 112 therebetween to form a channel between the source electrode 108 and the drain electrode 110, and an ohmic contact layer 116 formed on the active layer 114 except for the channel for ohmic contact with the source electrode 108 and the drain electrode 110.

An inorganic passivation layer 118 formed of an inorganic insulating material and an organic passivation layer 128 formed of an organic insulating material are sequentially formed on the thin film transistor. The organic passivation layer 128 is formed to planarize the substrate 101 provided with the thin film transistor thereon. The inorganic passivation layer 118 is formed to improve stability of interfaces between the organic passivation layer 128 and each of the gate insulating layer 112 and the source and drain electrodes 108 and 110.

The light emitting cell includes a first electrode 122 formed on the organic passivation layer 128, an organic light emitting layer 124 including a light emitting layer and formed on the first electrode 122, and a second electrode 126 formed on the organic light emitting layer 124.

The organic light emitting layer 124 includes a hole-related layer, a light emitting layer, and an electron-related layer sequentially formed on the first electrode 122 or in reverse order. The organic light emitting layer 124 is formed in a bank hole 104 defined by a bank insulating layer 102 that partitions each luminescent region.

The first electrode 122 is electrically connected to the drain electrode 110 of the thin film transistor via a pixel contact hole 120 that penetrates the inorganic passivation layer 118 and the organic passivation layer 128. The first electrode 122 has a structure formed by laminating an opaque conductive material such as aluminum (Al) and a transparent conductive material such as indium tin oxide (ITO). In this regard, the opaque conductive material contained in the first electrode 122 reflects light, which is generated in the organic light emitting layer 124 and proceeds toward the substrate 101, toward the second electrode 126.

The second electrode 126 is formed on the organic light emitting layer 124. The second electrode 126 is formed of a transparent conductive material such as ITO. Thus, light generated in the organic light emitting layer 124 is emitted upward through the second electrode 126.

The capping layer 130 induces maximum constructive interference between light beams generated in the organic light emitting layer 124 to efficiently emit light generated in the organic light emitting layer 124 to the outside. That is, the capping layer 130 reflects light beams, which has a predetermined intensity insufficient to pass through the capping layer 130 or less, among light beams generated in the organic light emitting layer 124. Here, light beams that cannot pass through the capping layer 130 are reflected by an interface between the capping layer 130 and the lowest layer of the front sealing layer 140. The light beams are repeatedly reflected by the interface due to resonance effects to cause constructive interference with other reflected light beams or light beams generated in the organic light emitting layer 124. In this case, intensity of the light beams is increased, and the light beams may pass through the capping layer 130.

In order to obtain such resonance effects, the capping layer 130 has a higher index of refraction than the lowest layer of the front sealing layer 140. To this end, the capping layer 130 may have a single layer or multilayer structure formed of $SiO_2$, $SiN_x$, ZnS, LiF, PA, PI, $TeO_2$, $WO_3$, $V_2O_5$, $Al_xO_x$, ZnSe, triamine derivatives, arylene diamine derivatives, CBP, or tris(8-hydroxyquinoline)aluminum (Alq3) complexes with a thickness of several to several hundreds of nm.

The front sealing layer 140 blocks infiltration of moisture or oxygen, thereby improving reliability.

Figure 2:
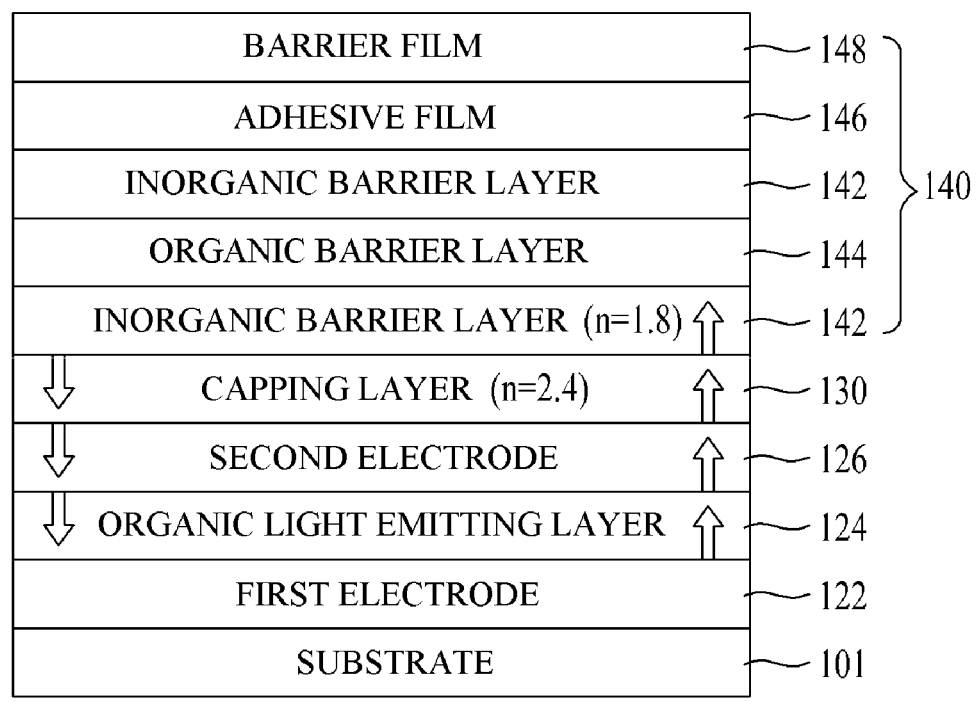
FIG. 2 is a cross-sectional view for describing an example of a front sealing layer illustrated in FIG. 1 in detail.

To this end, the front sealing layer 140 includes at least one inorganic barrier layer 142, at least one organic barrier layer 144, an adhesive film 146, and a barrier film 148 sequentially stacked as illustrated in FIG. 2.

The at least one inorganic barrier layer 142 is alternately formed with the organic barrier layer 144 at least once to primarily block infiltration of external moisture or oxygen. In this context, when referring to "an inorganic barrier layer (referred to as layer "A") is alternately formed with an organic barrier layer (referred to as layer "B"), or "an inorganic barrier layer is alternately laminated on an organic barrier layer" it means that layer "A" and layer "A" are formed subsequently in a way of "A-B", "A-B-A", "A-B-A-B", "A-B-A-B-A", etc. The inorganic barrier layer 142 is formed of at least one selected from the group consisting of aluminum oxide ($Al_xO_x$), silicon oxide ($SiO_x$), $SiN_x$, SiON, and LiF.

The organic barrier layer 144 secondarily blocks infiltration of external moisture or oxygen. In addition, the organic barrier layer 144 functions as a buffer layer that relieves stress between layers caused by bending of the organic light emitting display device and enhances planarization performance. The organic barrier layer 144 is formed of an acrylic resin, an epoxy resin, or polymers such as polyimide or polyethylene.

The barrier film 148 is bonded to the substrate 101 provided with the thin film transistor and the light emitting cell via the adhesive film 146 formed on the bottom surface of the barrier film 148 to seal the light emitting cell.

A plurality of thin films 142, 144, 146, and 148 contained in the front sealing layer 140 respectively have a thickness of several to several hundreds of μm which is greater than that of the capping layer 130 and do not have influence on resonance effects by interference.

In addition, among the plurality of thin films 142, 144, 146, and 148 contained in the front sealing layer 140, the inorganic barrier layer 142 in contact with the capping layer 130 is formed to have a lower index of refraction than the capping layer 130.

Particularly, the capping layer 130 is formed to have a high index of refraction of 1.3 to 3.1, and the inorganic barrier layer 142 constituting the lowest layer of the front sealing layer 140 is formed to have a low index of refraction of 1.2 to 3. For example, as illustrated in FIG. 2, the inorganic barrier layer 142 constituting the lowest layer of the front sealing layer 140, formed of $SiN_x$, and having a thickness of about 0.5 to 100 μm has an index of refraction of 1.8. The capping layer 130 adjacent to the inorganic barrier layer 142, formed of an antimony-based compound, and having a thickness of about 20 to 200 nm has an index of refraction of 2.4, greater than that of the inorganic barrier layer 142 constituting the lowest layer of the front sealing layer 140.

Figure 3:
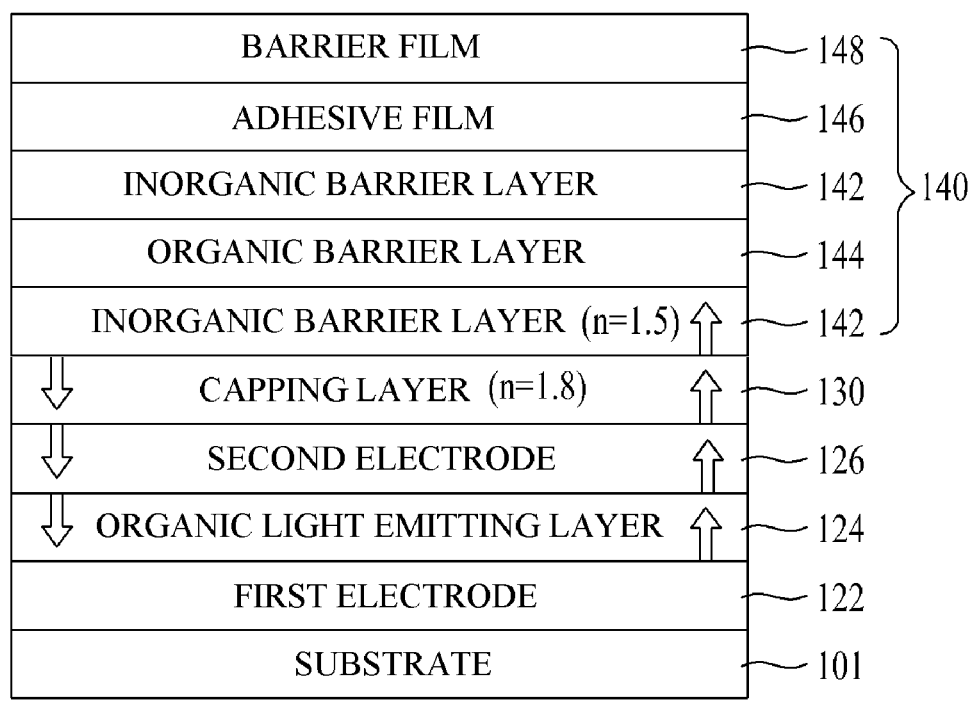
FIG. 3 is a cross-sectional view describing another example of the front sealing layer illustrated in FIG. 1 in detail.

In addition, as illustrated in FIG. 3, the inorganic barrier layer 142 constituting the lowest layer of the front sealing layer 140, formed of SiON, and having a thickness of about 0.5 to 100 μm has an index of refraction of 1.5. The capping layer 130 adjacent to the inorganic barrier layer 142, formed of SiNx, and having a thickness of about 20 to 200 nm has an index of refraction of 1.8, greater than that of the inorganic barrier layer 142 that is the lowest layer of the front sealing layer 140.

As described above, according to one embodiment, the inorganic barrier layer 142 constituting the lowest layer of the front sealing layer 140 may be formed of a material having a different index of refraction from that of a material used to form the capping layer 130 contacting the inorganic barrier layer 142. Accordingly, the inorganic barrier layer 142 and the capping layer 130 may have different indexes of refraction.

Due to such index of refraction difference between the capping layer 130 and the inorganic barrier layer 142, transflective characteristics may be obtained at an interface between the capping layer 130 and the inorganic barrier layer 142. Interference caused by transflective characteristics may improve resonance effects.

Figure 4:
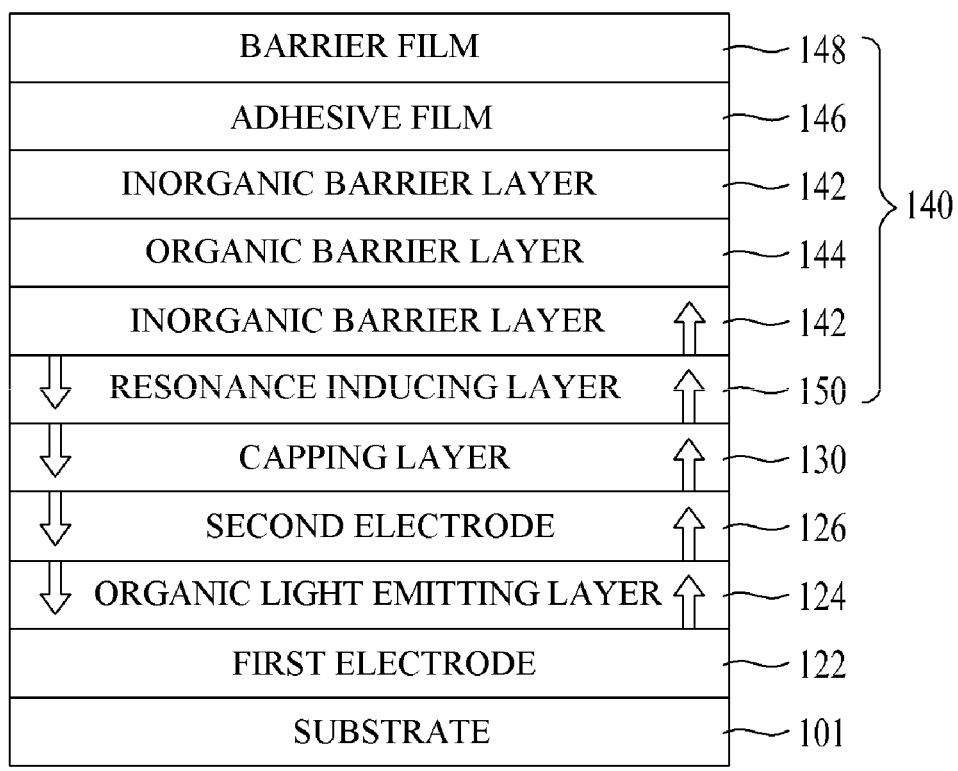
FIG. 4 is a cross-sectional view illustrating an organic light emitting display panel according to a second embodiment.

FIG. 4 is a cross-sectional view illustrating an organic light emitting display panel according to a second embodiment.

The organic light emitting display panel illustrated in FIG. 4 has the same elements except that a resonance inducing layer 150 is further formed in comparison with the organic light emitting display panels illustrated in FIGS. 2 and 3 and thus a detailed description thereof will not be given.

The resonance inducing layer 150 is formed of at least one selected from the group consisting of PA, PI, triamine derivatives, arylene diamine derivatives, CBP, tris(8-hydroxyquinoline)aluminum (Alq3) complexes, $SiN_x$, $SiO_x$, SiON, and LiF between the capping layer 130 and the lowest inorganic barrier layer 142 disposed at the lowest layer of the plurality of thin films contained in the front sealing layer 140. The resonance inducing layer 150 has a lower index of refraction than those of the capping layer 130 and the lowest inorganic barrier layer 142 disposed at both sides of the resonance inducing layer 150. In this regard, the capping layer 130 and the lowest inorganic barrier layer 142 may have the same or different indexes of refraction. For example, the resonance inducing layer 150 may have an index of refraction of 1.2 to 3, and the lowest inorganic barrier layer 142 and the capping layer 130 may have indexes of refraction of 1.3 to 3.1. Particularly, for example, the capping layer 130 is formed of SiNx and has an index of refraction of 1.8, the lowest inorganic barrier layer 142 is formed of $SiN_x$ and has an index of refraction of 1.8, and the resonance inducing layer 150 is formed of SiON and has an index of refraction of 1.5.

Accordingly, optical resonance occurs when light generated in the organic light emitting layer 124 is brought to the interface between the capping layer 130 having a high index of refraction and the resonance inducing layer 150 having a low index of refraction and the interface between the resonance inducing layer 150 having a low index of refraction and the lowest inorganic barrier layer 142 having a high index of refraction. Due to such optical resonance, light generated in the organic light emitting layer 124 is efficiently emitted to the outside, improving luminous efficacy.

Figure 5:
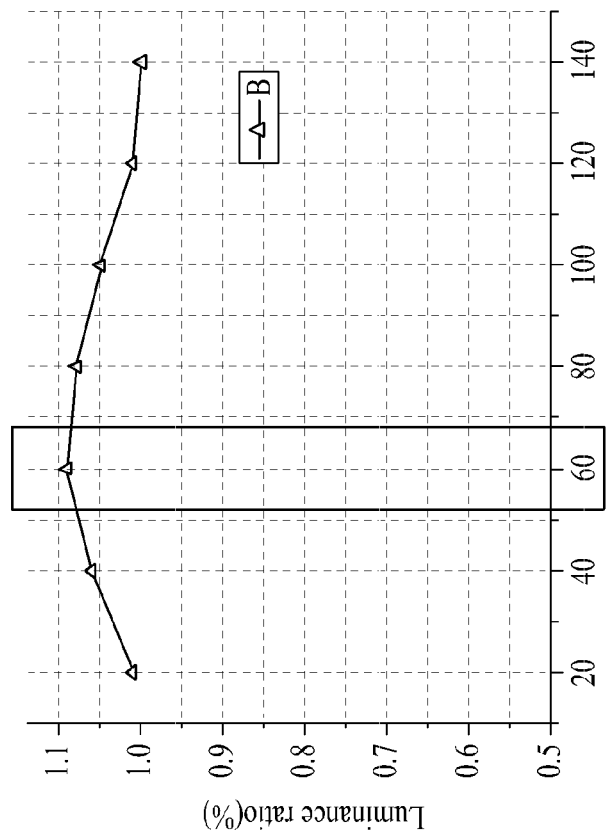
FIG. 5 illustrates a graph and a table for describing efficiency of blue light of an organic light emitting display panel according to the one embodiment and a conventional organic light emitting display panel.

FIG. 5 illustrates a graph and a table for describing efficiency of blue light of the organic light emitting display panel according to the second embodiment of and a conventional organic light emitting display panel.

In a conventional organic light emitting display panel, which does not include the resonance inducing layer 150 as illustrated in FIG. 4, i.e., when the thickness of the resonance inducing layer 150 is 0 nm, there is no difference in index of refraction between the capping layer 130 and the lowest inorganic barrier layer 142 as illustrated in FIG. 5. Thus, interference caused by transflective characteristics does not occur at the interface between the capping layer 130 and the lowest inorganic barrier layer 142. As a result, optical resonance does not occur.

On the other hand, when the resonance inducing layer 150 is formed between the capping layer 130 and the lowest inorganic insulating layer 142 as illustrated in FIG. 4, optical resonance occurs due to the difference in index of refraction between the capping layer 130 and the resonance inducing layer 150 at the interface between the capping layer 130 having a high index of refraction and the resonance inducing layer 150 having a low index of refraction by light generated in the organic light emitting layer 124. In addition, optical resonance occurs due to the difference in index of refraction between the resonance inducing layer 150 and the lowest inorganic barrier layer 142 at the interface between the resonance inducing layer 150 having a low index of refraction and the lowest inorganic barrier layer 142 having a high index of refraction by light generated in the organic light emitting layer 124. Due to such optical resonance, light generated in the organic light emitting layer 124 is efficiently emitted to the outside, thereby improving luminous efficacy. Particularly, when the resonance inducing layer 150 is formed of SiON to a thickness of about 60 to 80 nm, luminous efficacy of blue light may be improved by 8% to 9% compared to the conventional organic light emitting display panel.

Figure 6:
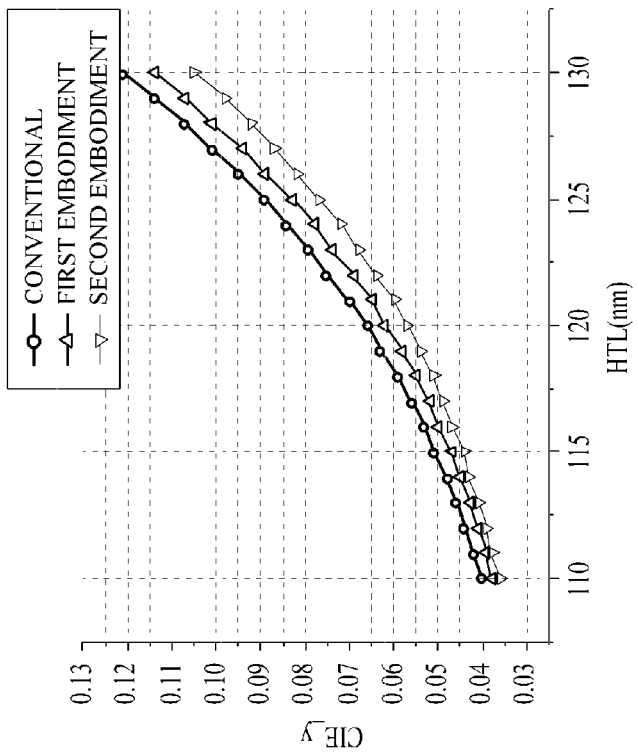
FIG. 6 illustrates a graph and a table for describing color coordinate changes of organic light emitting display panels according to one embodiment and a conventional organic light emitting display panel with respect to thickness of a hole transport layer.

FIG. 6 illustrates a graph and a table for describing color coordinate changes of organic light emitting display panels according to one embodiment and a conventional organic light emitting display panel with respect to thickness of a hole transport layer.

As illustrated in FIG. 6, when the index of refraction of the lowest inorganic barrier layer 142 is lower than that of the capping layer 130 as illustrated in FIGS. 2 and 3, a lower CIE-y coordinate value may be obtained when compared with a conventional organic light emitting display panel in which there is no index of refraction difference between the capping layer 130 and the lowest inorganic barrier layer 142. In addition, when the resonance inducing layer 150 is disposed between the capping layer 130 and the lowest inorganic barrier layer 142 as illustrated in FIG. 4, a far lower CIE_y coordinate value may be obtained when compared to the structure in which the index of refraction of the lowest inorganic barrier layer is lower than that of the capping layer as illustrated in FIGS. 2 and 3.

Accordingly, when the hole transport layers (HTLs) of the organic light emitting display panel according to the embodiments herein and the conventional organic light emitting display panel have the same thickness, the CIE_y coordinate value is lower than that of the conventional organic light emitting display panel. Thus, color reproduction rate may be increased according to the present invention.

Meanwhile, according to the embodiments herein, the light emitting cells may have different thicknesses of the capping layer and/or the resonance inducing layer to obtain maximum constructive interference in consideration of optical properties and wavelengths of red, green, and blue light which are respectively emitted by a red light emitting cell, a green light emitting cell, and a blue light emitting cell.

As is apparent from the above description, the capping layer and the lowest layer of the front sealing layer that is in contact with the capping layer have different indexes of refraction. Due to such index of refraction difference between the capping layer and the lowest layer, optical resonance occurs at the interface therebetween by light generated in the organic light emitting layer. Thus, light generated in the organic light emitting layer is efficiently emitted to the outside, thereby improving luminous efficacy.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display panel comprising:
   a first electrode on a substrate;
   an organic light emitting layer on the first electrode;
   a second electrode on the organic light emitting layer;
   at least one capping layer over the second electrode, the capping layer having an index of refraction;
   a front sealing layer on the capping layer and comprising a plurality of thin films, wherein the plurality of thin films of the front sealing layer comprise a resonance inducing layer on the capping layer, a first inorganic barrier layer on the resonance inducing layer, an organic barrier layer on the first inorganic barrier layer, a second inorganic barrier layer on the organic barrier layer, an adhesive film on the second inorganic barrier layer, and a barrier film on the adhesive film; and
   wherein the first inorganic barrier layer has a multilayer structure that is distinct from the organic barrier layer and the second inorganic barrier layer, the multilayer structure of the first inorganic barrier layer comprising at least two selected from the group consisting of silicon oxide ($SiO_x$), silicon oxynitride (SiON), silicon nitride ($SiN_x$), aluminum oxide ($Al_xO_x$), and lithium fluoride (LiF),
   wherein an index of refraction of the resonance inducing layer is lower than both the index of refraction of the capping layer and an index of refraction of the first inorganic barrier layer, and wherein the index of refraction of the capping layer is higher than the index of refraction of the first inorganic barrier layer,
   wherein the resonance inducing layer has a single layer structure or a multilayer structure using at least one material selected from the group consisting of PA, PI, triamine derivatives, arylene diamine derivatives, CBP, tris(8-hydroxyquinoline)aluminum (Alq3) complexes, and lithium fluoride (LiF), and
   wherein a thickness of the resonance inducing layer is in a range of 60 to 80 nm, such that optical resonance occurs at both of an interface between the resonance inducing layer and the capping layer and an interface between the resonance inducing layer and the first inorganic barrier layer.

2. The organic light emitting display panel according to claim 1, wherein the index of refraction of the first inorganic barrier layer is in a range of 1.2 to 3, and the index of refraction of the capping layer is in a range of 1.3 to 3.1.

3. The organic light emitting display panel according to claim 1, wherein the first inorganic barrier layer has a thickness in a range of 0.5 to 100 μm and the capping layer has a thickness in a range of 20 to 200 nm.

4. The organic light emitting display panel according to claim 1, wherein the capping layer has a single layer structure or a multilayer structure comprising silicon dioxide ($SiO_2$), silicon nitride ($SiN_x$), zinc sulfide (ZnS), lithium fluoride (LiF), PA, PI, tellurium dioxide ($TeO_2$), tungsten trioxide ($WO_3$), vanadium oxide ($V_2O_5$), aluminum oxide ($Al_xO_x$), zinc selenide (ZnSe), triamine derivatives, arylene diamine derivatives, CBP, or tris(8-hydroxyquinoline)aluminum (Alq3) complexes.

5. The organic light emitting display panel according to claim 1, wherein the index of refraction of the resonance inducing layer is in a range of 1.2 to 3, and the index of refraction of the first inorganic barrier layer and the index of refraction of the capping layer are both in a range of 1.3 to 3.1.

6. The organic light emitting display panel according to claim 1, wherein light generated by the organic light emitting layer passes through the capping layer, the resonance inducing layer, the first inorganic barrier layer, the organic barrier layer, the second inorganic barrier layer, the adhesive film, and the barrier film.

* * * * *